(12) United States Patent
Frey et al.

(10) Patent No.: US 7,696,649 B2
(45) Date of Patent: Apr. 13, 2010

(54) POWER CONTROL CIRCUITRY AND METHOD

(75) Inventors: Christophe Frey, Meylan (FR); Andrew John Sowden, Whittlesford (GB)

(73) Assignee: ARM Limited, Cambridge (GB)

( * ) Notice: Subject to any disclaimer, the term of this patent is extended or adjusted under 35 U.S.C. 154(b) by 287 days.

(21) Appl. No.: 11/889,456

(22) Filed: Aug. 13, 2007

(65) Prior Publication Data

US 2009/0045677 A1 Feb. 19, 2009

(51) Int. Cl.
*H01H 7/00* (2006.01)
*H01H 9/54* (2006.01)

(52) U.S. Cl. .................... 307/141; 307/139; 307/141.4; 326/33; 326/34; 327/544

(58) Field of Classification Search ................. 307/139, 307/141, 141.4; 326/33, 34; 327/544
See application file for complete search history.

(56) References Cited

U.S. PATENT DOCUMENTS

| | | | |
|---|---|---|---|
| 5,614,847 A * | 3/1997 | Kawahara et al. | 326/98 |
| 6,275,440 B2 * | 8/2001 | Noda et al. | 365/227 |
| 7,279,927 B2 * | 10/2007 | Falkowski et al. | 326/33 |
| 2006/0220676 A1 * | 10/2006 | Kanazawa | 326/33 |

OTHER PUBLICATIONS

Kumagai et al.: "A Novel Powering-down Scheme for Low Vt CMOS Circuits," IEEE, 1998 Symposium on VLSI Circuits Digest of Technical Papers, pp. 44 and 45.

Mizuno et al.: "ChipOS: Open Power-Management Platform to Overcome the Power Crisis in Future LSIs," 2001 IEEE International Solid-Stage Circuits Conference, three pages.

Lynn et al.: Universal Serial Bus (USB) Power Management, 1997 IEEE, pp. 434-441.

Blue et al.: "X2000 Advanced Avionics Project Development of a New Generation of Avionics for Space Applications," 2003 IEEE, vol. 5-2303, pp. 1-12.

* cited by examiner

*Primary Examiner*—Albert W Paladini
*Assistant Examiner*—Hal I Kaplan
(74) *Attorney, Agent, or Firm*—Nixon & Vanderhye P.C.

(57) ABSTRACT

The power control circuitry comprises a series of power switching circuits, each power switching circuit being associated with one of the circuit portions and being provided with an enable signal and responsive to its enable signal being set to connect the voltage source to the at least one voltage line of the associated circuit portion. Further, at least one enable qualifying circuit is provided, each such enable qualifying circuit being associated with one of the power switching circuits and being arranged to generate an output signal used to determine the enable signal provided to a later power switching circuit in the series. Each enable qualifying circuit sets its output signal when both the enable signal provided to the associated power switching circuit is set and the at least one voltage line of the circuit portion associated with that power switching circuit has reached a predetermined voltage level.

18 Claims, 11 Drawing Sheets the present invention relates to power control circuitry, and to a method of operating such circuitry, such power control circuitry being arranged to control the connection of a voltage source to an associated circuit.

POWER CONTROL CIRCUITRY AND METHOD

BACKGROUND OF THE INVENTION

1. Field of the Invention

The present invention relates to power control circuitry, and to a method of operating such circuitry, such power control circuitry being arranged to control the connection of a voltage source to an associated circuit.

2. Description of the Prior Art

In a data processing system, it is often the case that many of the circuits within the system spend a significant proportion of the time inactive. However, even when inactive, those circuits can consume significant power due to leakage current. Accordingly, it is known to provide power control circuitry in association with such circuits to disconnect those circuits from a voltage source when they are not being used, and to then reconnect them to the voltage source when those circuits need again to become active.

FIG. 1 is a schematic diagram illustrating a known power control circuitry that can be provided in association with a circuit 40. In this example, the power control circuitry comprises a plurality of PMOS transistors 10, 20, 30 provided in parallel between an operating supply voltage $V_{DD}$ and a voltage line 50 used by the circuit 40, this voltage line 50 also being referred to herein as a virtual $V_{DD}$ line (VVDD). When the circuit 40 is to be disconnected from the power supply $V_{DD}$, for example when it is entering a standby mode of operation, each of the PMOS transistors 10, 20, 30 receives a power off signal at a logic one level at their gate inputs 15, 25, 35, respectively, which causes those transistors to be turned off, and hence causes the voltage line 50 to be isolated from the operating supply voltage $V_{DD}$. When the circuit 40 is later required to enter an active mode of operation, then the power off signals are cleared to a logic zero level, thus causing each of the transistors 10, 20, 30 to turn on and pull the voltage line 50 up to the operating supply voltage $V_{DD}$.

Whilst three PMOS transistors are shown in FIG. 1, it will be appreciated that the number of PMOS transistors provided will vary dependent on embodiment, and indeed in some embodiments only a single PMOS transistor may be required. Further, the voltage line 50 illustrated in FIG. 1 may actually consist of a number of discrete voltage lines, each of which services particular portions of the circuit 40. In addition, the circuit 40 may take a variety of forms. For example, in one embodiment this circuit 40 may take the form of a memory device. Alternatively, the circuit may comprise any logic block within a data processing system, for example a processor core, an arithmetic logic unit (ALU) within a core, a memory controller device, a video controller, etc.

In addition to using such power control circuitry in association with the operating supply voltage, similar circuitry can also be used in association with other voltage sources applied to the circuitry 40, for example the ground voltage. The Article "A Novel Powering-Down Scheme for Low Vt CMOS Circuits" by K Kumagai et al, ULSI Device Development Laboratories, NEC Corporation, 1998 Symposium on VLSI Circuits, Digest of Technical Papers, shows in FIG. 1 a circuit having power control circuitry provided in association with both the operating supply voltage $V_{DD}$ and the ground voltage. In that paper, diodes are also provided in parallel with the transistors of the power control circuitry to limit the change in voltage that can occur on the voltage lines of the circuit, hence ensuring that data can be retained in the standby mode, referred to therein as the sleep mode.

Irrespective of whether the circuit of any particular implementation requires any data holding mechanisms such as the above-mentioned diode mechanism in order to allow the circuit to hold data values whilst it is in the standby mode, a common problem that can occur in any circuit employing power control circuitry is a problem of inrush current when the circuit is later re-connected to the voltage source. Generally, during the shift from the standby state to the active state, a large capacitance may be required to charge up the voltage line 50 to the operating supply voltage $V_{DD}$ and to charge any internal nodes within the circuit 40 that are required to be at the operating supply voltage level when the circuit is in its active state of operation. A large inrush current (voltage surge) may occur in the power supply $V_{DD}$ during this charging period, and this large inrush current may cause voltage drops in the power supply $V_{DD}$, which might potentially cause other circuits using the power supply $V_{DD}$ to malfunction. It will be appreciated that a similar problem can also be exhibited on other voltage source lines connected to the active circuit using similar power control circuitry, for example the ground line discussed earlier. In particular, any variations in the ground voltage line may again cause other circuits to malfunction.

One way of seeking to reduce the inrush current is described in the article "ChipOS: Open Power-Management Platform to Overcome the Power Crisis in Future LSIs" by H Mizuno et al, 2001 IEEE International Solid-State Circuits Conference. As described therein, when a voltage source is to be applied to a particular logic block, the gates of the power switches provided in power limiter circuitry associated with that logic block are driven with a low slew rate. Accordingly, the voltage on the gates of those power switches is increased relatively slowly so that those switches turn on relatively slowly, and accordingly the time taken to charge up the voltage line of the logic block to the voltage level of the connected voltage source is increased, thereby limiting the peak current. In accordance with the technique described in the article, the gates are driven with a low slew rate by first driving those gates lines with a small driver and only later driving those lines with a large driver. However, whilst such an approach can limit the peak current, and thereby reduce the inrush current, the approach of using simple circuits such as a weak driver to reduce the slew rate of the power switch enable signal provided to the gates of the power switches is very sensitive to manufacturing process variations, and accordingly the amount of current limitation that can be achieved will vary significantly dependent on such process variations. As a result, such an approach does not provide a very reliable technique for reducing inrush current.

The article "Universal Serial Bus (USB) Power Management" by K Lynn, Wescon 97 Conference Proceedings, 4-6 Nov. 1997, Pages 434 to 441, also describes a technique for reducing the inrush current by slowing down the turn-on time of the power switches in the power control circuitry. In accordance with the technique mentioned therein, the power switches are provided with a charge pump which slows the turn-on time to between 1 ms and 2 ms. Whilst the use of more complex analog circuits such as the above-mentioned charge pumps can remove some of the process sensitivity that would be exhibited by the earlier-mentioned technique for limiting the slew rate of the enable signals provided to the power switch gates, their increased complexity adds to the area of the power control circuitry which in turn increases cost.

The article "X2000 Advanced Avionics Project Development of a New Generation of Avionics for Space Applications" by R Blue et al, Aerospace Conference 2003, Proceedings 2003 IEEE, Volume 5, 8-15 Mar. 2003, Pages 5-2303 to 5-2314, describes a number of avionics building block modules, including modules for power distribution and power regulation. A power switch slice is described, and it is mentioned that inrush current control is provided within the power switch slice, but no details of how that is achieved is discussed.

It would be desirable to provide an improved technique for limiting inrush current when employing power control circuitry to control the connection of a voltage source to an associated circuit, which is less susceptible to process variations, but is also less costly to implement than known solutions employing analog circuits such as charge pumps.

SUMMARY OF THE INVENTION

Viewed from a first aspect, the present invention provides power control circuitry for controlling the connection of a voltage source to an associated circuit when that associated circuit is to enter an active state of operation, the associated circuit having a plurality of circuit portions, each said circuit portion having at least one voltage line for connection to the voltage source, the power control circuitry comprising: a series of power switching circuits, each power switching circuit being associated with one of said circuit portions and being provided with an enable signal, each power switching circuit being responsive to its enable signal being set to connect the voltage source to said at least one voltage line of said associated circuit portion; and at least one enable qualifying circuit, each enable qualifying circuit being associated within one of the power switching circuits and generating an output signal used to determine the enable signal provided to a later power switching circuit in the series, each enable qualifying circuit setting its output signal when both the enable signal provided to the associated power switching circuit is set and said at least one voltage line of the circuit portion associated with that power switching circuit has reached a predetermined voltage level.

In accordance with the present invention, a series of power switching circuits are provided within the power control circuitry, each power switching circuit being associated with a circuit portion of the circuit whose power consumption is being controlled. When an enable signal provided to a power switching circuit is set, this causes that power switching circuit to connect the voltage source to the associated circuit portion, to thereby bring the voltage on one or more voltage lines within that circuit portion to the voltage level of the voltage source.

In accordance with the present invention, at least one enable qualifying circuit is provided, each such enable qualifying circuit being associated with one of the power switching circuits. When the enable signal of the associated power switching circuit is set, and the voltage on the relevant voltage line(s) of the associated circuit portion has reached a predetermined voltage level, the enable qualifying circuit then sets its output signal, and that output signal is then used to determine the enable signal provided to a later power switching circuit in the series.

By such an approach, the turning on of the various power switching circuits can be staggered so as to limit the peak current, and accordingly reduce inrush current that might otherwise occur if all of the power switching circuits were turned on at the same time. Since the enable qualifying circuit only sets its output signal when the associated power switching circuit has been enabled and the charging function achieved by that power switching circuit has caused the voltage level on the relevant voltage line(s) to reach a predetermined voltage level, then this enables the enable signal provided to a later power switching circuit in the series to only be set once that predetermined voltage level has been achieved in a circuit portion associated with an earlier power switching circuit (i.e. the power switching circuit with which the enable qualifying circuit is associated). By controlling the setting of the enable signals in such a manner, then the staggering of the setting of the enable signals can be achieved in a manner which is independent of process variation in the components of the power control circuitry. Furthermore, the enable qualifying circuit can be readily provided by simple digital components, thereby significantly reducing the area and hence cost when compared with complex analog solutions that seek to reduce inrush current.

When referring herein to signals being set, it will be appreciated that the "set" state may be indicated by either a logic zero level or a logic one level, dependent on implementation.

It might be considered that an alternative way to stagger the setting of the enable signals to the various power switching circuits would be to insert one or more components such as inverters between each power switch enable signal to introduce the required delays. However, since in modern technologies gate delay is very small it is likely that a large amount of CMOS gates (of which inverters are an example) would be required, and such gates are becoming more and more sensitive to process technology. The present invention is hence significantly advantageous over such an approach, since the staggering of the enable signals is achieved in a manner which is independent of such process variations.

The power switching circuits can take a variety of forms. However, in one embodiment, each power switching circuit comprises at least one switching element connected between the voltage source and the at least one voltage line of the associated circuit portion. In one particular embodiment, each power switching circuit comprises a plurality of switching elements connected in parallel between the voltage source and the at least one voltage line of the associated circuit portion.

The switching elements can take a variety of forms. In one embodiment, each switching element comprises a transistor arranged to receive the enable signal at its gate. Typically, for power control circuitry seeking to pull the voltage level on one or more voltage lines up to a higher potential such as an operating supply voltage $V_{DD}$, each switching element will comprise a PMOS transistor, whereas in the example of power control circuitry seeking to pull the voltage level on one or more voltage lines down to a lower potential such as a ground potential, each switching element will typically comprise an NMOS transistor.

In an alternative embodiment, each switching element comprises a pass gate. A pass gate is equally able to pull the voltage level of a voltage line up to a voltage level such as $V_{DD}$ or to pull the voltage level on a voltage line down to a voltage level such as ground potential.

The enable qualifying circuit can be arranged in a variety of ways. In one embodiment, each enable qualifying circuit comprises an output signal generating component for generating the output signal based on a first input indicative of the enable signal provided to the associated power switching circuit and a second input indicative of the voltage level of the at least one voltage line of the circuit portion associated with that power switching circuit. For each enable qualifying circuit, the predetermined voltage level which when reached in the presence of a set enable signal causes the output signal generating component to set its output signal can be arranged to be dependent on operating characteristics of that output signal generating component. For example, it will typically be the case that when the enable signal provided to the associated power switching circuit is set, the value applied to the first input of the output signal generating component will relatively quickly reach a value which is priming the output signal generating component to set its output signal dependent on the value of the second input. However, the value on the second input will typically change more gradually reflecting the more gradual change in voltage level occurring on the at least one voltage line after the power switching circuit has been enabled. The operating characteristics of the output signal generating component can be used to govern the point at which the value on the second input is considered to transition from one digital level to another digital level, thereby causing the output signal to become set.

Hence, it will be appreciated that in one embodiment the operating characteristics of the output signal generating component can be chosen prior to manufacture having regard to the desired voltage level which is to be reached prior to the output signal being set. Additionally, in one embodiment, each enable qualifying circuit may further include delay circuitry associated with the second input to alter the predetermined voltage level. It will be appreciated that if a delay is introduced, then there is some lag between the value on the relevant voltage line changing and that change being reflected at the second input of the output signal generating component, and this can be used to alter the voltage level reached on the voltage line before the output signal is set.

In addition to the output signal generating component, the enable qualifying circuit may include one or more further components dependent on the implementation. For example, in one embodiment, each enable qualifying circuit further comprises inverter logic for inverting at least one of the enable signal and the voltage level signal prior to supply to the first input or second input, respectively, of the output signal generating component. By appropriate use of inverters, this can simplify the logic required in the output signal generating component.

In one embodiment, each enable qualifying circuit further comprises level detection logic for monitoring the voltage level of the at least one voltage line and for generating an indication of that voltage level to be provided as the second input to the output signal generating component. By such an approach, a more accurate detection of the voltage on the voltage line reaching the predetermined voltage level can be achieved. In one particular embodiment, the level detection logic is tuneable to vary the predetermined voltage level which when reached in the presence of a set enable signal causes the output signal generating component to set its output signal. Dependent on the choice of level detection logic used, such tuning may occur post-manufacture. For example, if the level detection logic takes the form of a comparator, then a reference voltage input to the comparator may be altered after manufacture to vary the predetermined voltage level at which the setting of the output signal from the enable qualifying circuit is triggered.

The voltage source can take a variety of forms. In one embodiment, the voltage source is an operating supply voltage, each power switching circuit when enabled pulls up the voltage on said at least one voltage line of said associated circuit portion towards that operating supply voltage, and each enable qualifying circuit sets its output signal when the voltage on said at least one voltage line of said associated circuit portion has reached or exceeded a predetermined proportion of the operating supply voltage.

In one particular such embodiment, each enable qualifying circuit comprises NAND logic having a first input that attains a logic 1 value when the enable signal is provided to the associated power switching circuit, and a second input that attains a logic 1 level when said at least one voltage line of said associated circuit portion has reached or exceeded said predetermined proportion of the operating supply voltage, thereby causing the output signal to be set to a logic 0 level when the first and second inputs attain logic 1 values.

In an alternative embodiment, the voltage source is a ground voltage, each power switching circuit when enabled pulls down the voltage on said at least one voltage line of said associated circuit portion towards that ground voltage, and each enable qualifying circuit sets its output signal when the voltage on said at least one voltage line of said associated circuit portion has reached or is less than the predetermined voltage.

In one particular such embodiment, each enable qualifying circuit comprises NOR logic having a first input that attains a logic 0 value when the enable signal is provided to the associated power switching circuit, and a second input that attains a logic 0 level when said at least one voltage line of said associated circuit portion has reached or is less than the predetermined voltage, thereby causing the output signal to be set to a logic 1 level when the first and second inputs attain logic 0 values.

The circuit with which the power control circuitry is associated may enter the active state of operation from one or more other states of operation. For example, the power control circuitry may be used to bring the associated circuit into an active state of operation from a power off mode, or alternatively may be used to bring the associated circuit to an active state of operation from a standby mode of operation in which the power control circuitry isolates the associated circuit from the voltage source, but the associated circuit retains some internal state that enables it to more readily be returned to the active state of operation than were it instead completely powered off.

The associated circuit may take a variety of forms, but in one embodiment is a memory device. However, the techniques of embodiments of the present invention may be applied to a wide variety of different logic blocks, for example a wide variety of multi-threshold CMOS (MTCMOS) circuits.

Viewed from a second aspect, the present invention provides a method of controlling the connection of a voltage source to a circuit when that circuit is to enter an active state of operation, the circuit having a plurality of circuit portions, each said circuit portion having at least one voltage line for connection to the voltage source, the method comprising the steps of: (a) providing a series of power switching circuits, each power switching circuit being associated with one of said circuit portions; (b) generating enable signals for each power switching circuit, each power switching circuit in response to its enable signal being set connecting the voltage source to said at least one voltage line of said associated circuit portion; and (c) during said generating step (b) employing at least one enable qualifying circuit, each enable qualifying circuit being associated within one of the power switching circuits and generating an output signal used to determine the enable signal provided to a later power switching circuit in the series, each enable qualifying circuit setting its output signal when both the enable signal provided to the associated power switching circuit is set and said at least one voltage line of the circuit portion associated with that power switching circuit has reached a predetermined voltage level.

Viewed from a third aspect, the present invention provides power control logic for controlling the connection of a voltage source to an associated circuit when that associated circuit is to enter an active state of operation, the associated circuit having a plurality of circuit portion means, each said circuit portion means having at least one voltage line means for connection to the voltage source, the power control logic comprising: a series of power switching means, each power switching means being associated with one of said circuit portion means and being provided with an enable signal, each power switching means being responsive to its enable signal being set for connecting the voltage source to said at least one voltage line means of said associated circuit portion means; and at least one enable qualifying means, each enable qualifying means being associated within one of the power switching means and for generating an output signal used to determine the enable signal provided to a later power switching means in the series, each enable qualifying means for setting its output signal when both the enable signal provided to the associated power switching means is set and said at least one voltage line means of the circuit portion means associated with that power switching means has reached a predetermined voltage level.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
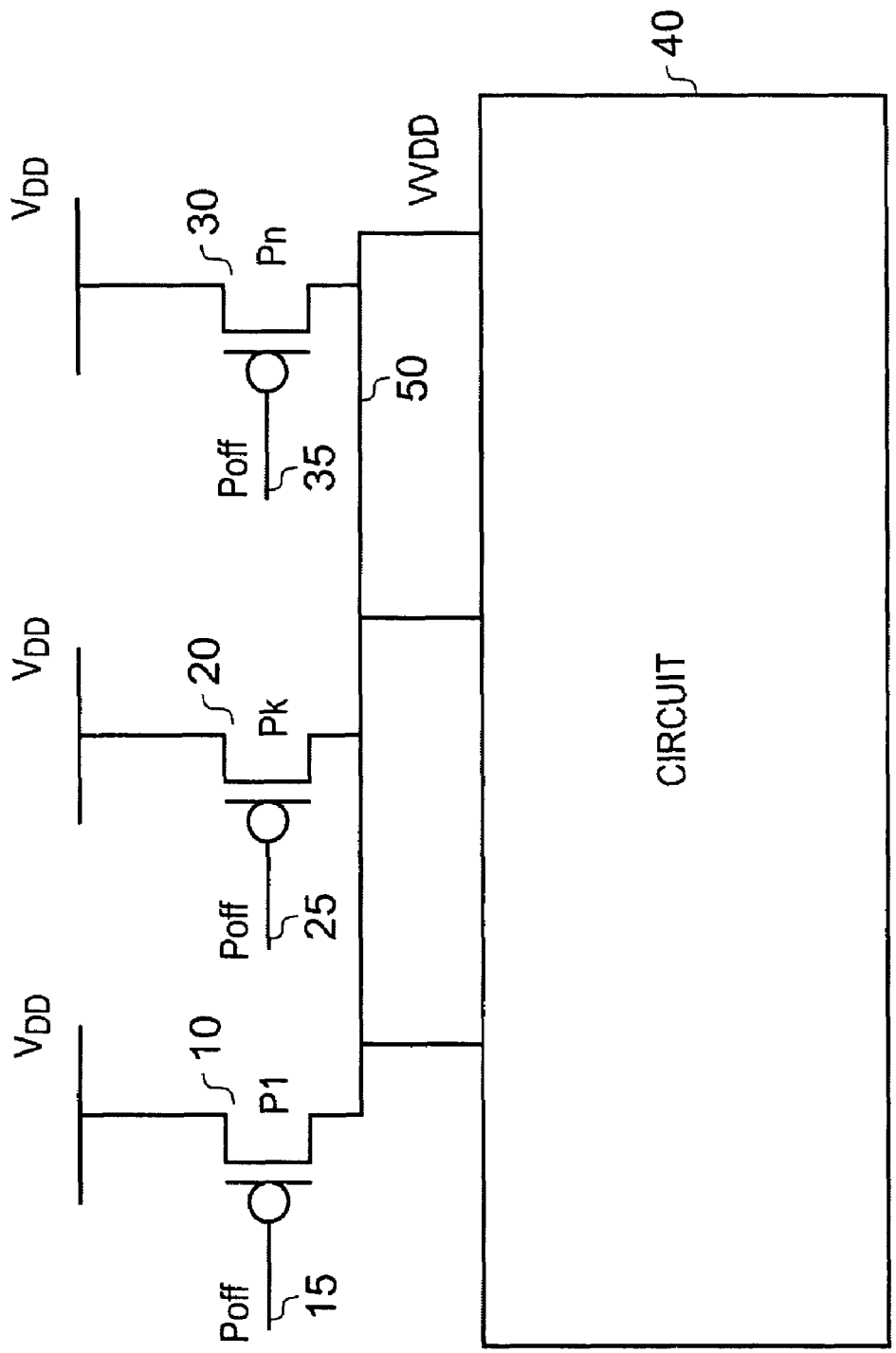
FIG. 1 is a diagram illustrating a known power control circuitry.
Figure 2:
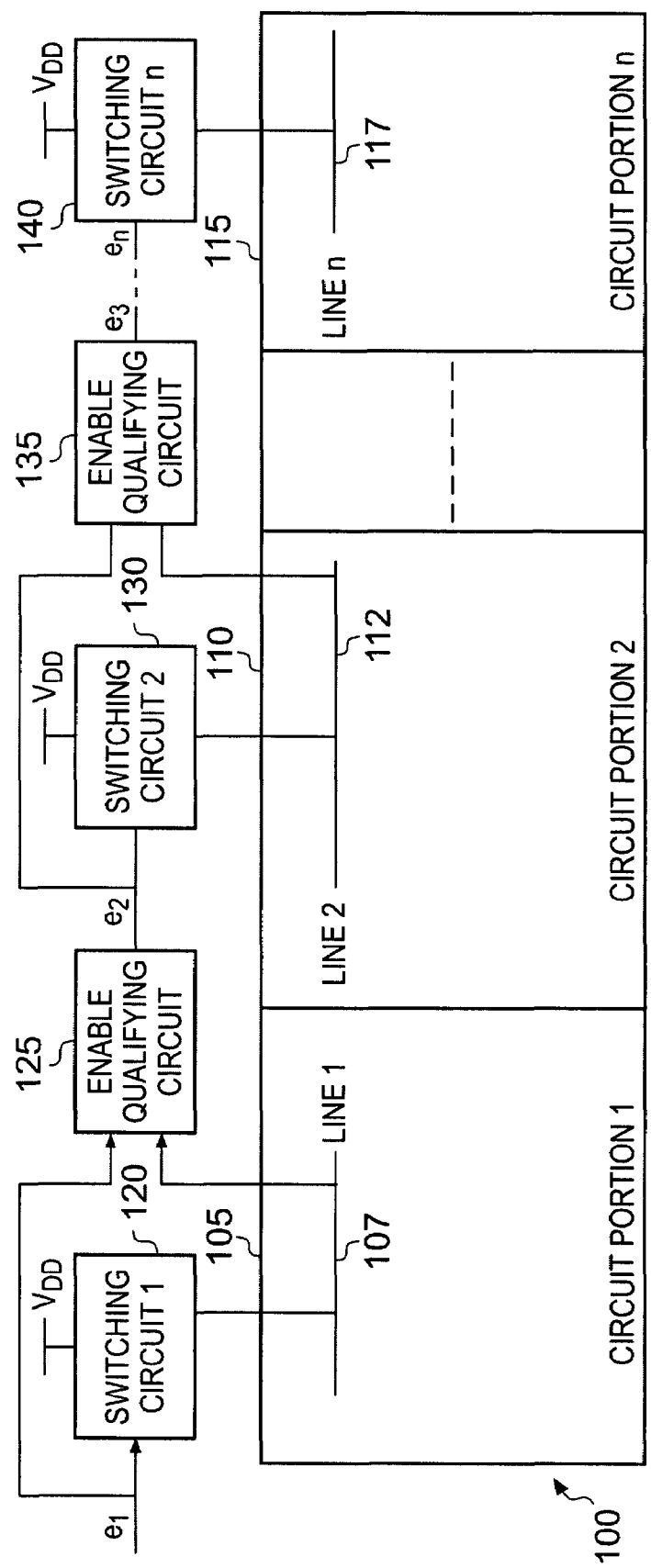
FIG. 2 is a block diagram schematically illustrating power control circuitry in accordance with embodiments of the present invention.

FIG. 2 is a diagram schematically illustrating power control circuitry in accordance with embodiments of the present invention. In accordance with such embodiments, the power control circuitry comprises a series of switching circuits 120, 130, 140 interposed by enable qualifying circuits 125, 135. The power control circuitry is used to control the connection of a voltage source, in this case an operating supply voltage $V_{DD}$, to an associated circuit 100 consisting of a plurality of circuit portions 105, 110, 115. A switching circuit of the power control circuitry is associated with each circuit portion, and each circuit portion has one or more voltage lines 107, 112, 117 which, when the associated switching circuits are turned on, are pulled up to the operating supply voltage $V_{DD}$. The enable signal $e_1$ is issued by system power control logic (not shown) and its value is dependent on whether the circuit 100 is to be placed in an active state or a standby state of operation.

Each enable qualifying circuit 125, 135 is associated with a switching circuit 120, 130, respectively, and its associated circuit portion 105, 110, respectively. Considering the enable qualifying circuit 125, this receives an indication of the enable signal $e_1$ provided to the associated switching circuit 120, and an indication of the voltage on the one or more voltage lines 107 of the associated circuit portion 105. Based on these two inputs, the enable qualifying circuit 125 outputs a signal used as the enable signal for the next switching circuit 130 in the series of switching circuits. The enable qualifying circuit 125 is arranged such that when the enable signal $e_1$ is set to turn on the switching circuit 120, the enable qualifying circuit will only set its output signal when the voltage level on the one or more voltage lines 107 has reach a predetermined voltage level. Accordingly, the setting of the enable signal $e_2$ provided to the switching circuit 130 is staggered with respect to the setting of the enable signal $e_1$ provided to the switching circuit 120 by a period of time which is dependent on the time taken for the one or more voltage lines 107 to be pulled up to the required predetermined voltage level.

The switching circuit 130 and its associated enable qualifying circuit 135 operate in an identical manner to the earlier-mentioned switching circuit 120 and enable qualifying circuit 125, and accordingly the setting of the enable signal $e_3$ provided to a third switching circuit (not shown) will also be staggered with regard to the setting of the second enable signal $e_2$ provided to the switching circuit 130.

One or more further switching circuits and enable qualifying circuits can be added into the power control circuitry dependent on the number of circuit portions which the circuit 100 is considered to consist of, in FIG. 2 there being considered to be n circuit portions. In this example, the enable signal $e_n$ provided to the final switching circuit 140 will be generated by an enable qualifying circuit associated with the switching circuit n−1 (not shown), and the final switching circuit 140 does not need to have any enable qualifying circuit provided in association therewith.

As will be discussed in more detail later, the choice of the predetermined voltage level on the relevant voltage line 107, 112 which causes the associated enable qualifying circuit 125, 135 to set its output in the presence of a set enable signal at its other input can be controlled in a number of ways. In one embodiment, each enable qualifying circuit includes an output signal generating component such as a NAND gate or a NOR gate which receives signals based on the two inputs shown in FIG. 2, and produces the output from the enable qualifying circuit dependent on the value of those two inputs. The operating characteristics of such an output signal generating component can be chosen prior to manufacture so as to in effect determine the predetermined voltage level at which the output from the enable qualifying circuit will be set. In addition, delay circuitry can be used to cause the second input to such output signal generating component to lag behind the change actually occurring on the relevant voltage line, so as to in effect alter the predetermined voltage level. In alternative embodiments, level detection logic can be provided within the enable qualifying circuitry for monitoring the voltage level on the relevant voltage line and then generating an indication of that voltage level for providing to the output signal generating component, such that the operating characteristics of the output signal generating component then have significantly less effect on the predetermined voltage level, and instead the level detection logic itself is used to tune the predetermined voltage level at which the output from the enable qualifying circuit is triggered.

Figure 3:
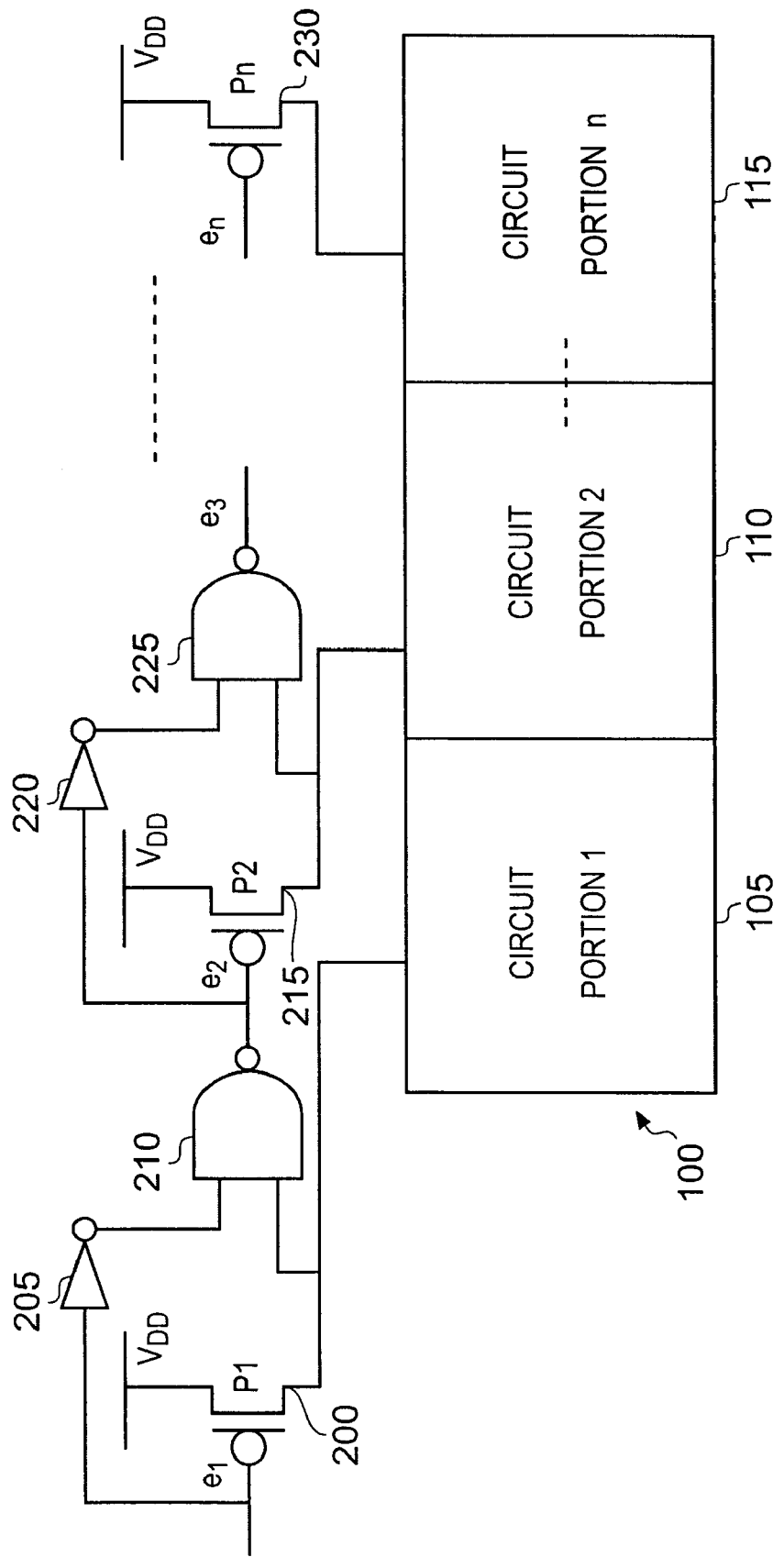
FIG. 3 is a diagram illustrating the power control circuitry in accordance with a first embodiment of the present invention.

FIG. 3 shows the power control circuitry of FIG. 2 in accordance with one particular embodiment. In this embodiment, each switching circuit 120, 130, 140 is formed by a PMOS transistor 200, 215, 230, respectively, Similarly, each enable qualifying circuit 125, 135 is constructed by a NAND gate 210, 225, respectively, in association with an inverter 205, 220, respectively, provided on the enable signal input. In such an embodiment, it will be appreciated that the enable signals need to be at a logic zero level in order to turn on the respective PMOS transistors 200, 215, 230. A NAND gate will only produce a logic zero output when both of its inputs are set to a logic one level. Hence, when the first enable signal $e_1$ is set to a logic zero level, the inverter 205 will prime the first input of the NAND gate 210 to a logic one level, but the second input will initially be at a logic zero level. As the first transistor 200 charges the relevant voltage line(s) within the first circuit portion 105 up towards $V_{DD}$, there will become a point where the second input is also considered to be at a logic one level, at which point the second enable signal $e_2$ will be set to the logic zero level, thereby turning on the PMOS transistor 215 associated with a second circuit portion 110. The inverter 220 and NAND gate 225 then operate in the same manner as the earlier-mentioned inverter 205 and NAND gate 210, resulting in the third enable signal $e_3$ being set at some subsequent point in time.

Figure 4:
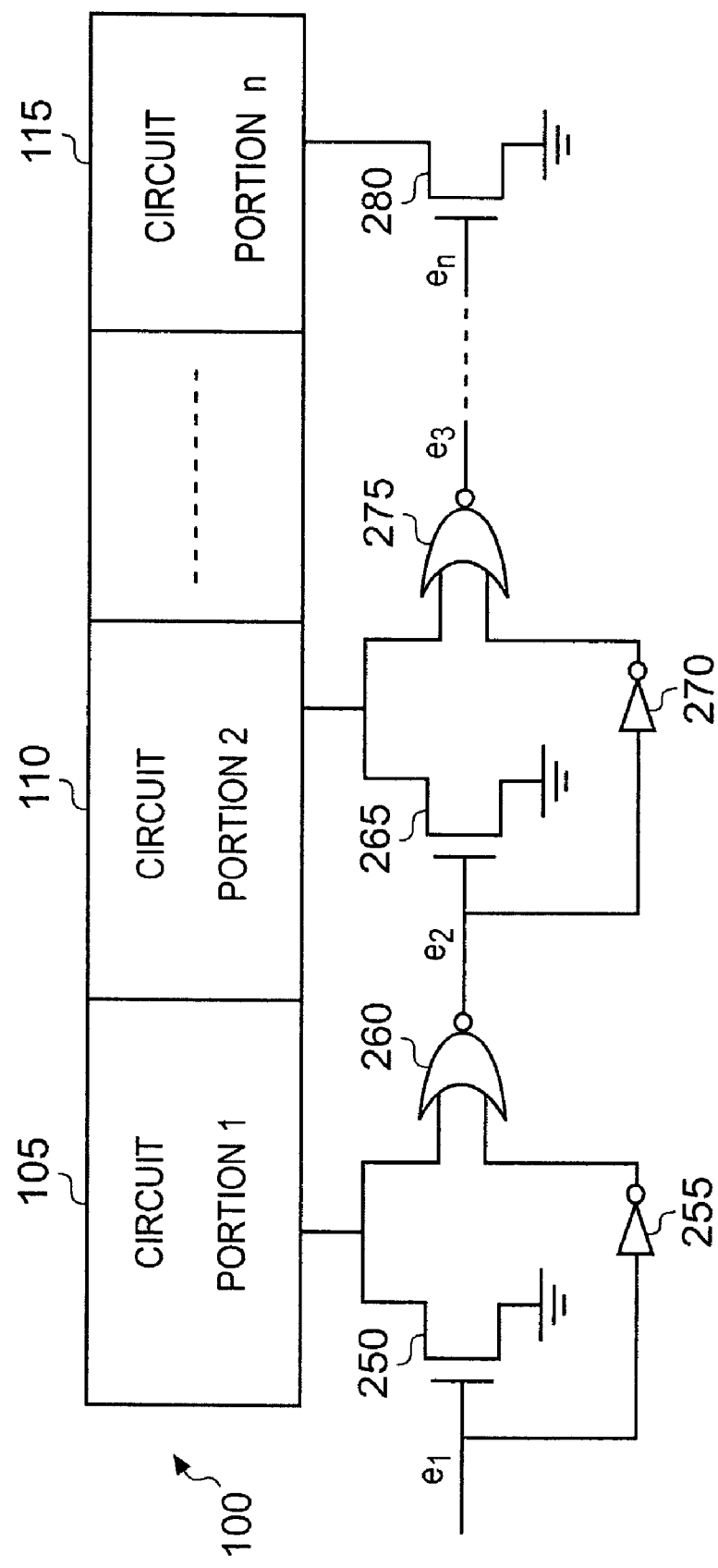
FIG. 4 is a diagram illustrating power control circuitry in accordance with a second embodiment of the present invention.

FIG. 4 illustrates power control circuitry in accordance with a second particular embodiment of the present invention, in this instance the power control circuitry being used to control the connection of a ground potential to each of the circuit portions 105, 110, 115. Due to the need to pull the relevant voltage line(s) within each circuit portion 105, 110, 115 down to a ground potential, rather than pulling them up to an operating supply voltage, NMOS transistors 250, 265, 280 will typically be used instead of the PMOS transistors 200, 215, 230 used in the embodiment of FIG. 3. Accordingly, in this example, the enable signals are set when they are given a logic one level value and the relevant inverters 255, 270 within the enable qualifying circuits will produce logic zero level outputs when the enable signals they are monitoring have been set.

Accordingly, in this example, it will be appreciated that each enable qualifying circuit needs to output a logic one level signal when the enable signal received by the associated switching circuit has been set, and the voltage level on the relevant voltage line(s) of the associated circuit portion have been pulled down to a predetermined level that can be interpreted as equating to a logic zero level. Accordingly, in this instance, NOR gates 260, 275 are provided within each enable qualifying circuit, which only when both inputs are set to a logic zero level will produce an output at a logic one level. Accordingly, it will be seen that the enable signal $e_2$ is only set to a logic one level when the first enable signal $e_1$ has been set to a logic one level and the voltage level on the relevant voltage line(s) within the circuit portion 105 has been pulled down to a predetermined voltage equating with a logic zero level at the other input to the NOR gate 260. The combination of inverter 270 and NOR gate 275 operate in an identical manner to stagger the generation of the enable $e_3$ with respect to the setting of the enable signal $e_2$.

Figure 5:
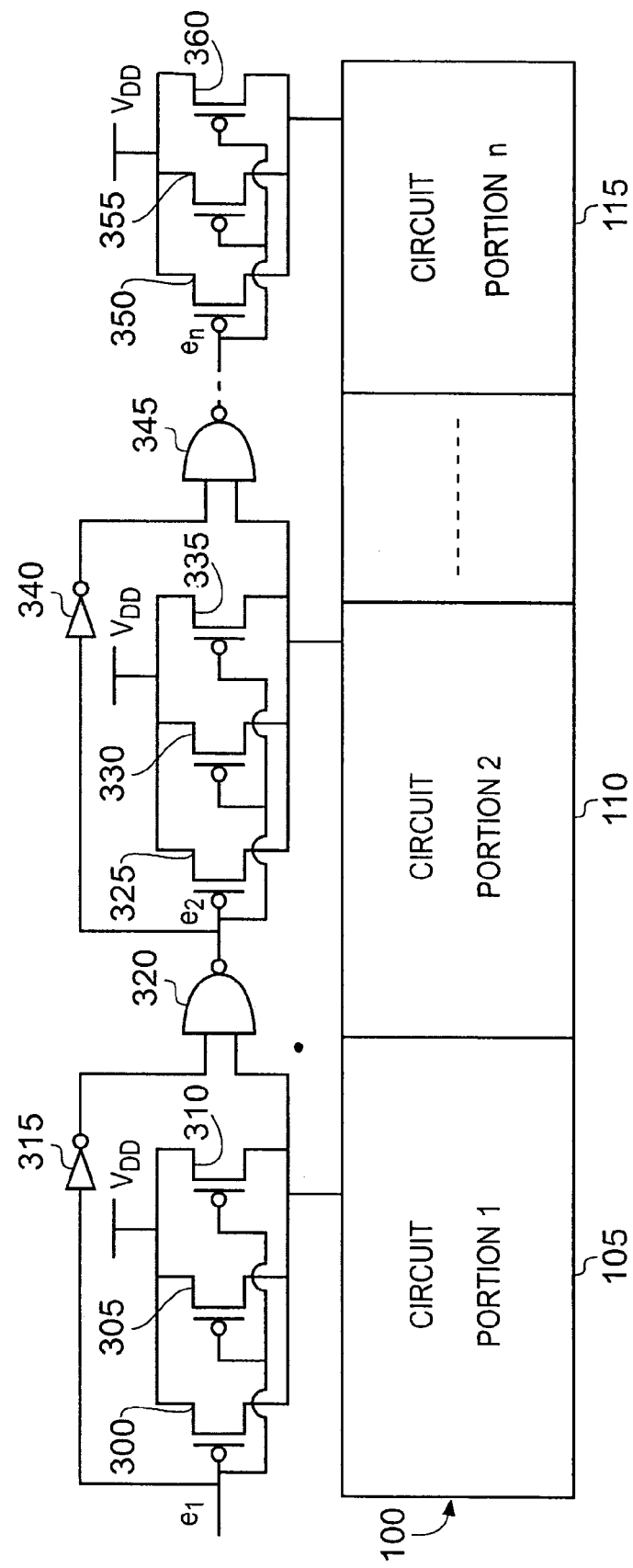
FIG. 5 is a diagram illustrating power control circuitry in accordance with a third embodiment of the present invention.

Whilst in FIGS. 3 and 4, the various switching circuits have been considered to consist of a single transistor, in alternative embodiments the switching circuits may take different forms. For example, FIG. 5 shows a third embodiment which is analogous to the earlier embodiment described with reference to FIG. 3, but in this case each of the single transistors 200, 215, 230 of FIG. 3 have been replaced with three PMOS transistors in parallel 300, 305, 310, 325, 330, 335, and 350, 355, 360, respectively. The inverters 315, 340 and NAND gates 320, 345 operate in an identical manner to the inverters 205, 220 and NAND gates 210, 225 of FIG. 3. By using multiple transistors in parallel, the switching circuits may be arranged to pull the internal voltage line(s) within the associated circuit portions up towards the operating supply voltage $V_{DD}$ more quickly, assuming similar strength PMOS transistors are used in the embodiment of FIG. 5 to those used in the embodiment of FIG. 3. The use of multiple transistors in parallel is also beneficial in situations where the use of a single equivalent larger transistor is impractical because of the limit in transistor width due to gate resistance increase.

FIGS. 6A to 6D illustrate alternative forms of switching circuit and associated enable qualifying circuit that may be used instead of the arrangement of the first embodiment of FIG. 3. Hence, considering FIG. 6A, the PMOS transistor 400, inverter 405 and NAND gate 410 operate in an identical manner to the elements 200, 205, 210, or 215, 220, 225 of FIG. 3. However, in this example, delay circuitry 420 is provided in association with the second input to the NAND gate 410 to increase the predetermined voltage level that must be reached before the output from the NAND gate 410 is set. In this particular example, the delay circuitry takes the form of a sequence of inverters, but it will be appreciated that alternative circuitry could be used instead of inverters to achieve the same effect of delaying the second input to the NAND gate 410.

Figure 6A:
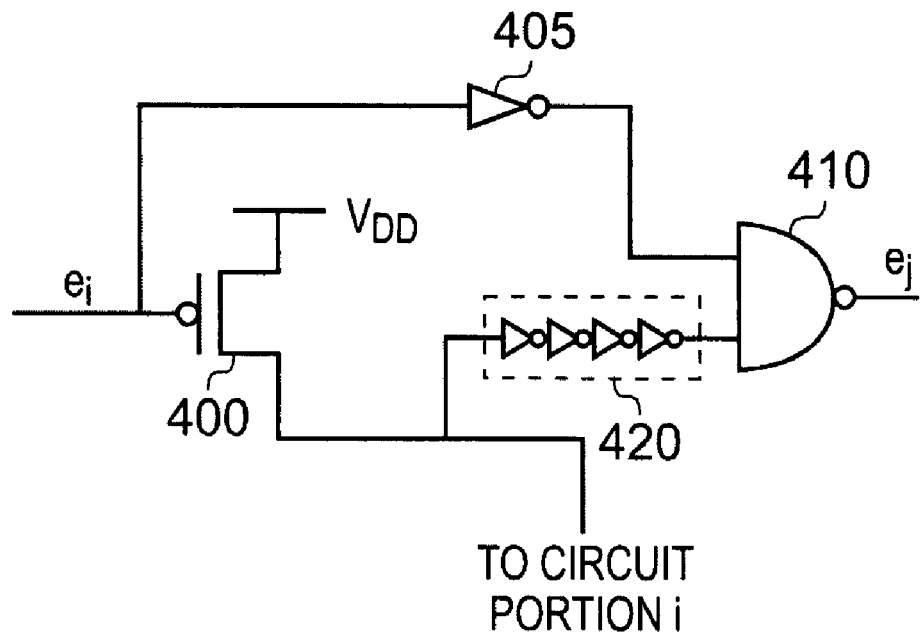
FIGS. 6A to 6D illustrate alternative constructions of switching circuit and associated enable qualifying circuit in accordance with alternative embodiments of the present invention.
Figure 6B:
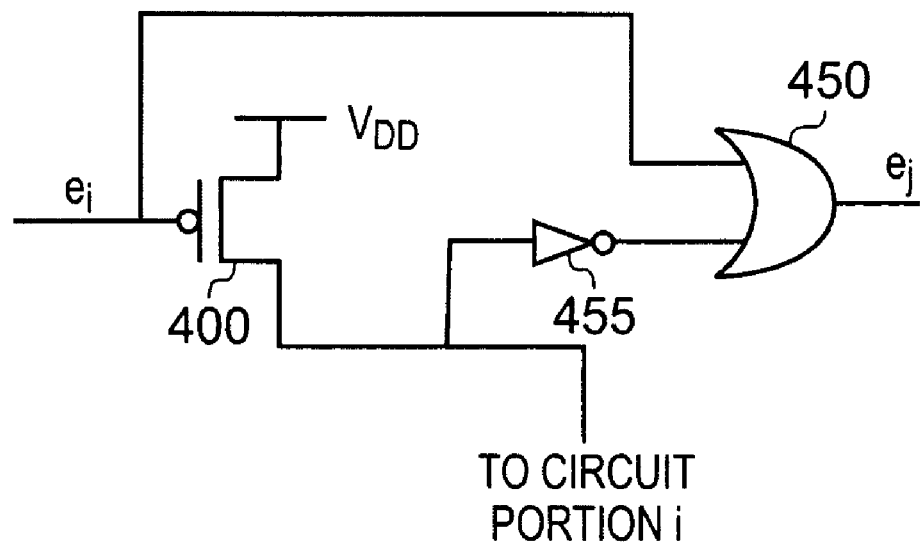

FIG. 6B illustrates an alternative embodiment where the inverter is provided in association with the second input rather than the first input as shown in FIG. 3. Accordingly, the inverter 455 on the second input and the OR gate 450 can replace the inverter 205 and NAND gate 210 or inverter 220 and NAND gate 225 of FIG. 3. The OR gate 450 will only output a logic zero level signal when both of its inputs are at a logic zero level. Whilst the first input to the OR gate is primed at a logic zero level as soon as the enable signal $e_i$ is set, the second input only reaches a logic zero level once the voltage on the relevant voltage line(s) within the circuit portion i has been pulled up to the predetermined voltage level, which will be dictated by the point at which the inverter 455 treats its input as being at a logic one level.

Figure 6C:
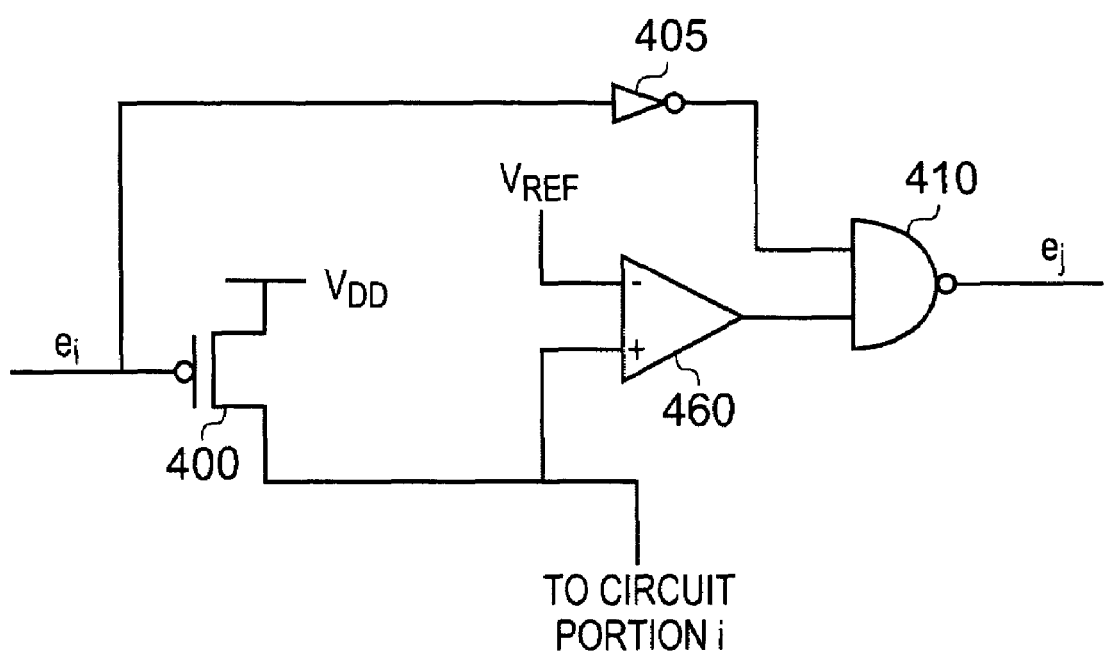

FIG. 6C illustrates a further alternative embodiment where a comparator 460 is included within the enable qualifying circuit. Hence, in this embodiment, the PMOS transistor 400, inverter 405 and NAND gate 410 operate in the same manner as the components 200, 205, 210 or 215, 220, 225 of FIG. 3, but the second input to the NAND gate 410 is governed by the output of the comparator 460. The comparator 460 is provided at one input with a reference voltage, and compares that reference voltage with the voltage on the relevant voltage line(s) of the circuit portion i. When the voltage level on that voltage line reaches the reference voltage, then the output of the comparator 460 is set to a logic one level so as to cause the output of the NAND gate 410 to transition to a logic zero level to accordingly set the enable signal $e_j$. The comparator 460 hence operates as level detection logic, which can provide a more accurate detection of a voltage level at which it is desired to trigger the setting of the enable signal $e_j$. In this embodiment, the operating characteristics of the NAND gate 410 become less important in determining the timing of the setting of the enable signal $e_j$. Further, it is possible to tune the comparator 460 after manufacture by altering the reference voltage provided as one of its inputs, so that the predetermined voltage level at which the enable signal $e_j$ is set can be altered post-manufacture.

FIG. 6A to 6C illustrate a number of ways in which the enable qualifying circuits can be altered, and it will be appreciated that they do not provide an exhaustive illustration of the changes that can be made to the enable qualifying circuit. The enable qualifying circuit can be constructed in any appropriate manner provided it serves to stagger the setting of the enable signals dependent on the voltage level achieved in the relevant voltage line(s) in the associated circuit portion.

Figure 6D:
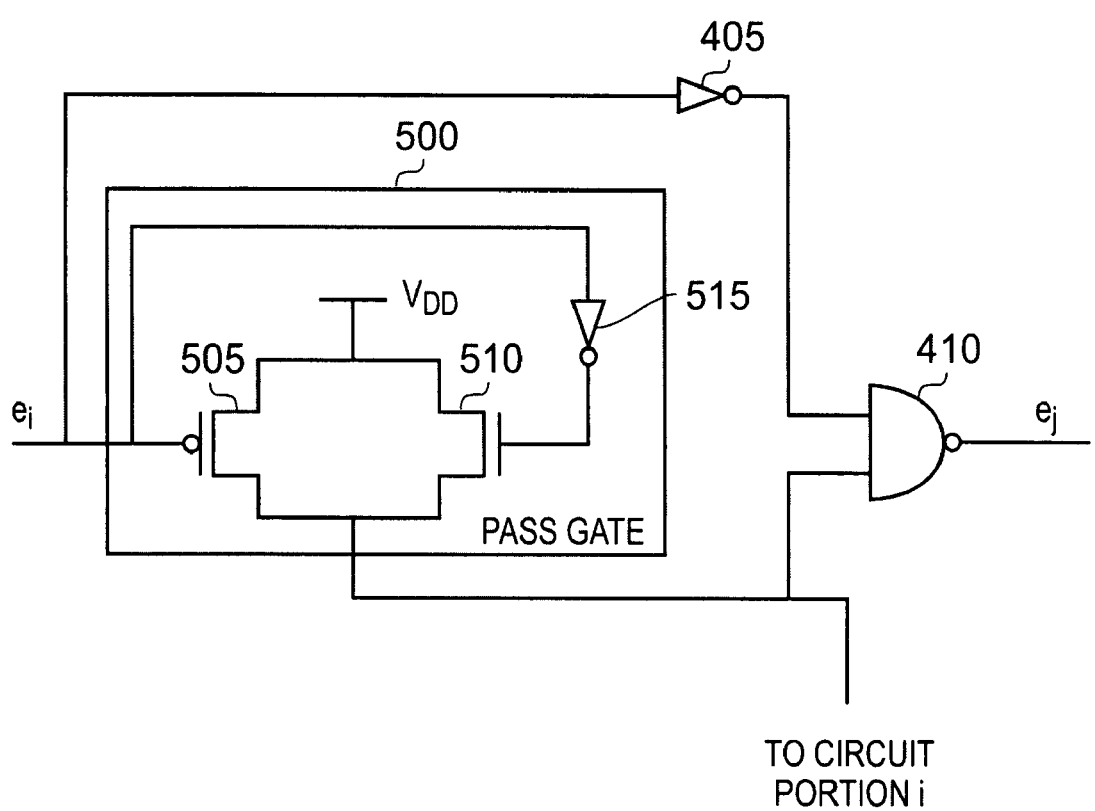

FIG. 6D illustrates an alternative embodiment of switching circuit that can be used instead of the PMOS transistors 200, 215, 230 of FIG. 3. In this embodiment, the inverter 405 and NAND gate 410 operate in the same manner as the elements 205, 210 or 220, 225 of FIG. 3, but each PMOS transistor 200, 215 is replaced with a pass gate 500. The pass gate 500 is constructed of a PMOS transistor 505 arranged back-to-back with an NMOS transistor 510, the input to the NMOS transistor 510 being an inverted version of the input to the PMOS transistor 505 by virtue of the inverter 515. Accordingly, it will be appreciated that when the enable signal $e_i$ is set to a logic zero level, both the PMOS transistor 505 and the NMOS transistor 510 will turn on and begin to pull the voltage on the relevant voltage line(s) of the circuit portion i up towards the operating voltage $V_{DD}$. It will be appreciated that a similar pass gate could also be used as an alternative to the NMOS transistors 250, 265, 280 of FIG. 4, in that case the inverter 515 being provided in association with the input to the PMOS transistor, and the enable signal being provided directly to the gate of the NMOS transistor so that again both transistors are turned on when the enable signal $e_i$ is set (in this example to a logic one level). An advantage of pass gates is that they serve equally well to pull voltages up towards a high voltage such as a power supply voltage or to pull voltages down towards a low voltage such as ground.

Figure 7:
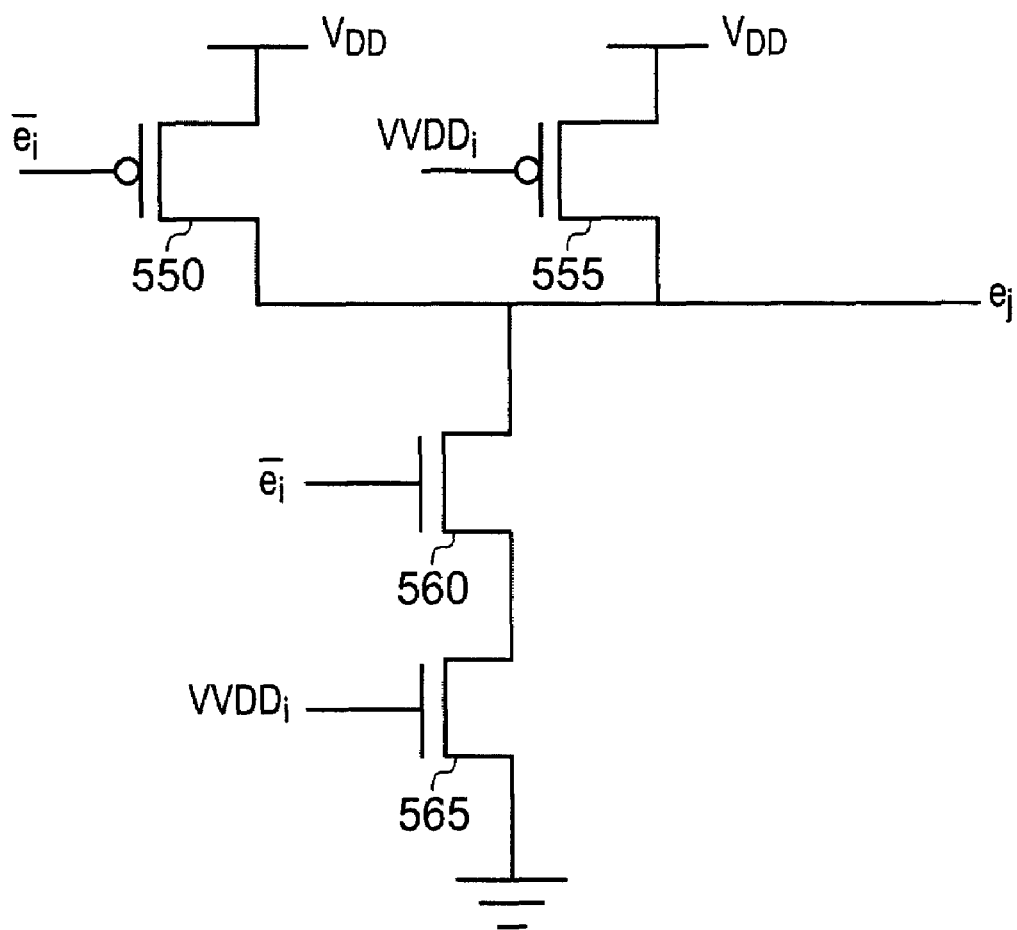
FIG. 7 is a diagram illustrating an example construction of a NAND gate that may be used within the enable qualifying circuits of embodiments of the present invention.

As mentioned earlier, the operating characteristics of output signal generating components such as the NAND gates 210, 225 of FIG. 3 or the NOR gates 260, 275 of FIG. 4 can be used to affect the predetermined voltage level at which the next enable signal in the series is set. To illustrate why the operating characteristics can achieve this, FIG. 7 is a diagram schematically illustrating one way in which a NAND gate can be constructed. It is assumed in FIG. 7 that the NAND gate is either the NAND gate 210 or the NAND gate 225 shown in FIG. 3. As can be seen, the NAND gate consists of two PMOS transistors 550, 555 in parallel, coupled with two NMOS transistors 560, 565 connected in series. The PMOS transistor 550 and NMOS transistor 560 are driven by the inverted enable signal obtained via the inverter of the enable qualifying circuit (see for example elements 205, 220 in FIG. 3). Similarly, the PMOS transistor 555 and NMOS transistor 565 are driven by the voltage level on the relevant voltage line(s) of the circuit portion i (referred to in FIG. 7 as $VVDD_i$). If all four transistors are weighted the same, then the output enable signal $e_j$ will switch state when the $VVDD_i$ voltage level is approximately $V_{DD}/2$. However, if the strength of the PMOS transistors 550, 555 is increased, this will make a transition to the logic zero level at the output $e_j$ occur less readily. In effect, the NAND gate will take longer to detect a logic one level at the second input, and accordingly the second input will need to transition to a voltage closer to $V_{DD}$ before the output from the NAND gate transitions to a logic zero level, thereby increasing the predetermined voltage level at which the switch takes place.

Figure 8:
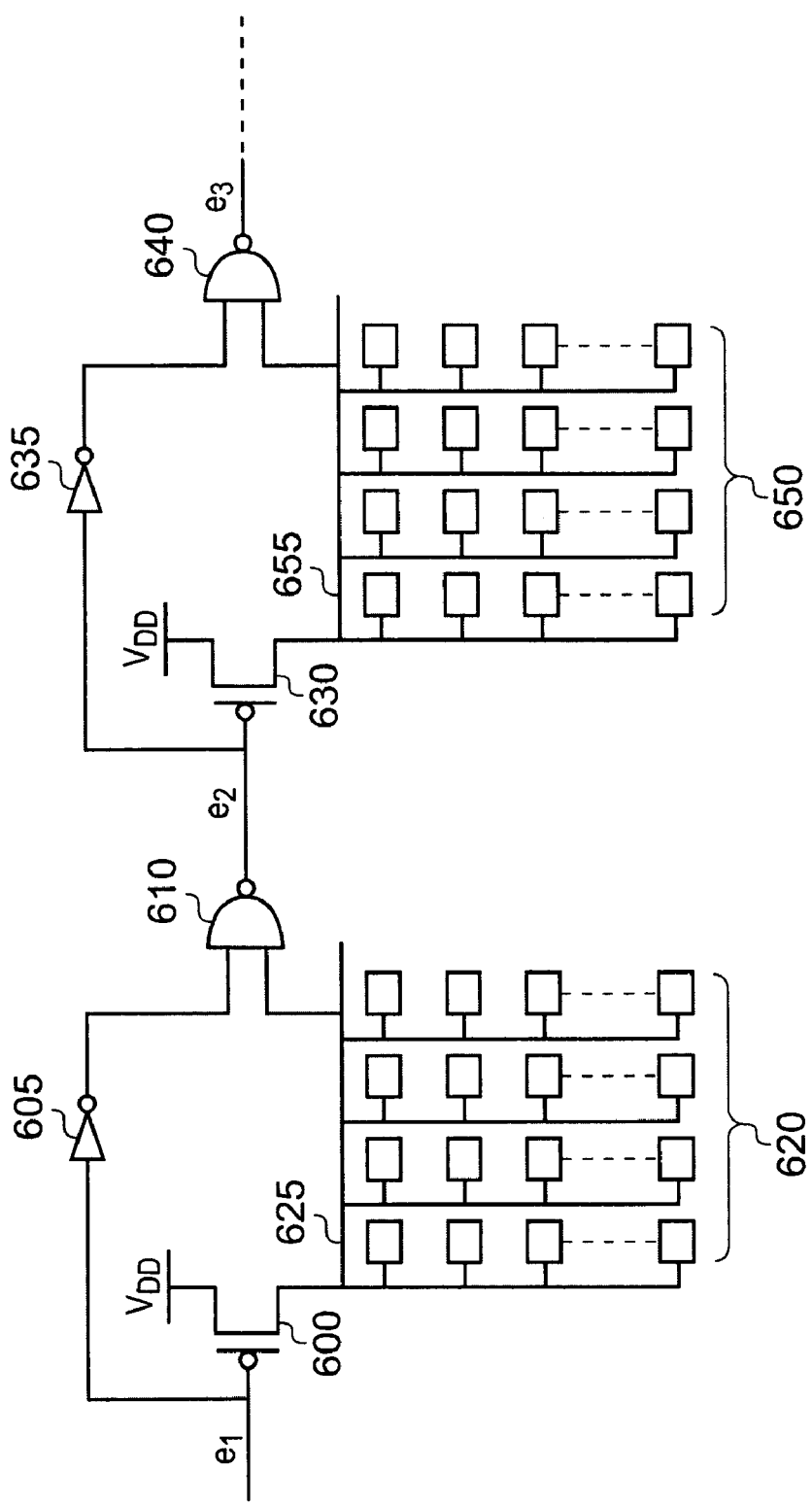
FIG. 8 schematically illustrates the use of power control circuitry of the first embodiment of the present invention in association with a memory device.

FIG. 8 is a particular example of the embodiment discussed earlier with reference to FIG. 3, for the situation where the circuit 100 takes the form of a memory device. Accordingly, the elements 600, 605, 610, 630, 635, 640 correspond to the elements 200, 205, 210, 215, 220 and 225 of FIG. 3. Within a memory device, different segments 620, 650 can be established, each segment including a plurality of rows and columns of memory cells that are provided with a voltage supply $V_{DD}$ from a common internal voltage line. Hence the memory cells in the segment 620 get their voltage supply $V_{DD}$ from the internal voltage line 625, and the memory cells within the segment 650 get their voltage supply $V_{DD}$ from the internal voltage line 655.

Whilst in the embodiment of FIG. 8 each segment is treated as a separate circuit portion, it will be appreciated that in some embodiments more than one segment can be considered to comprise a single circuit portion with the voltage lines of those multiple segments being charged up via the same switching circuit. Hence, by way of example, if the memory device is considered to consist of four segments due to the presence of four separate voltage lines, this does not necessarily mean that four switching circuits need to be provided, and in an alternative embodiment two switching circuits separated by an enable qualifying circuit could be provided, with each switching circuit charging up two voltage lines.

Figure 9:
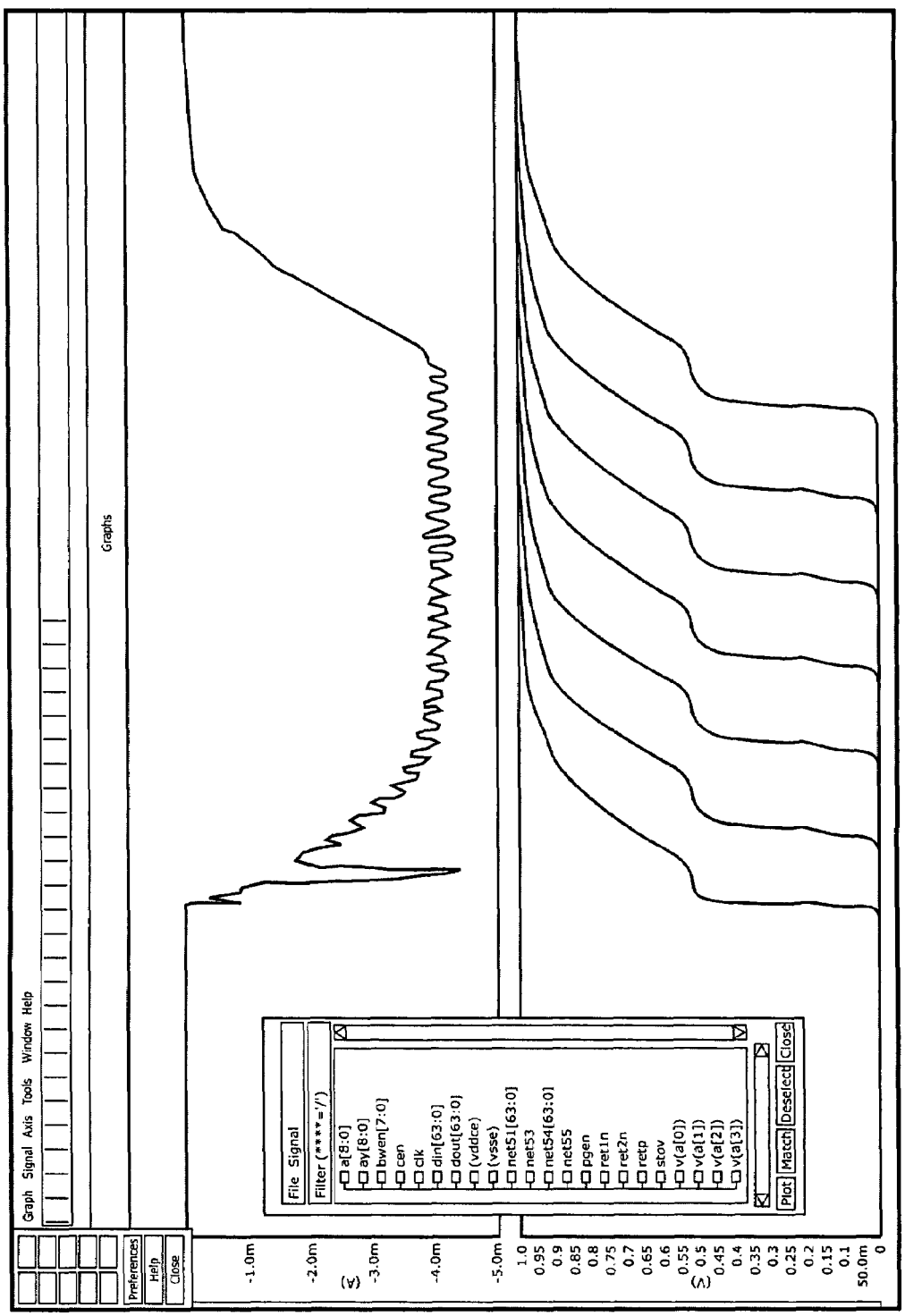
FIG. 9 is a chart illustrating the reduction in peak current that can be achieved through staggering of the turning on of the various power switching circuits when adopting power control circuitry in accordance with embodiments of the present invention.

FIG. 9 is a graph showing simulation results of how the inrush current is contained as a result of staggering the turning on of the enable signals through use of embodiments of the present invention. In the example shown, six enable qualifying circuits are provided for producing six staggered set enable signals from the originally supplied enable signal to a first switching circuit. The peak current is significantly reduced with respect to what would be expected if all of the switching circuits had been enabled at the same time, and accordingly the inrush current is significantly reduced. The initial spike of current shown on the left-hand side of the current graph in FIG. 9 relates to a different power region in the circuit being monitored, where the delayed turn-on scheme of embodiments of the present invention is not used, and hence is not relevant to the current discussion.

From the above description of embodiments of the present invention, it will be appreciated that such embodiments provide a simple and effective mechanism for reducing inrush current in a manner which is independent of process variations, and which avoids the use of more complex analog circuits such as charge pumps proposed in accordance with prior art techniques.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Power control circuitry for controlling the connection of a voltage source to an associated circuit when that associated circuit is to enter an active state of operation, the associated circuit having a plurality of circuit portions, each said circuit portion having at least one voltage line for connection to the voltage source, the power control circuitry comprising:

a series of power switching circuits, each power switching circuit being associated with one of said circuit portions and being provided with an enable signal, each power switching circuit being responsive to its enable signal being set to connect the voltage source to said at least one voltage line of said associated circuit portion; and at least one enable qualifying circuit, each enable qualifying circuit being associated with one of the power switching circuits and generating an output signal used to determine the enable signal provided to a later power switching circuit in the series, each enable qualifying circuit setting its output signal when both the enable signal provided to the associated power switching circuit is set and said at least one voltage line of the circuit portion associated with that power switching circuit has reached a predetermined voltage level.

2. Power control circuitry as claimed in claim 1, wherein each power switching circuit comprises at least one switching element connected between the voltage source and said at least one voltage line of said associated circuit portion.

3. Power control circuitry as claimed in claim 2, wherein each power switching circuit comprises a plurality of switching elements connected in parallel between the voltage source and said at least one voltage line of said associated circuit portion.

4. Power control circuitry as claimed in claim 2, wherein each switching element comprises a transistor arranged to receive the enable signal at its gate.

5. Power control circuitry as claimed in claim 2, wherein each switching element comprises a pass gate.

6. Power control circuitry as claimed in claim 1, wherein:
each enable qualifying circuit comprises an output signal generating component for generating the output signal based on a first input indicative of the enable signal provided to the associated power switching circuit and a second input indicative of the voltage level of said at least one voltage line of the circuit portion associated with that power switching circuit;
for each enable qualifying circuit, the predetermined voltage level which when reached in the presence of a set enable signal causes the output signal generating component to set its output signal is dependent on operating characteristics of that output signal generating component.

7. Power control circuitry as claimed in claim 6, wherein each enable qualifying circuit includes delay circuitry associated with said second input to alter the predetermined voltage level.

8. Power control circuitry as claimed in claim 6, wherein each enable qualifying circuit further comprises inverter logic for inverting at least one of the enable signal and the voltage level signal prior to supply to the first input or second input, respectively, of the output signal generating component.

9. Power control circuitry as claimed in claim 1, wherein each enable qualifying circuit comprises:
an output signal generating component for generating the output signal based on a first input indicative of the enable signal provided to the associated power switching circuit and a second input indicative of the voltage level of said at least one voltage line of the circuit portion associated with that power switching circuit; and
level detection logic for monitoring the voltage level of said at least one voltage line and for generating an indication of that voltage level to be provided as said second input to the output signal generating component.

10. Power control circuitry as claimed in claim 9, wherein said level detection logic is tuneable to vary the predetermined voltage level which when reached in the presence of a set enable signal causes the output signal generating component to set its output signal.

11. Power control circuitry as claimed in claim 1, wherein the voltage source is an operating supply voltage, each power switching circuit when enabled pulls up the voltage on said at least one voltage line of said associated circuit portion towards that operating supply voltage, and each enable qualifying circuit sets its output signal when the voltage on said at least one voltage line of said associated circuit portion has reached or exceeded a predetermined proportion of the operating supply voltage.

12. Power control circuitry as claimed in claim 11, wherein each enable qualifying circuit comprises NAND logic having a first input that attains a logic 1 value when the enable signal is provided to the associated power switching circuit, and a second input that attains a logic 1 level when said at least one voltage line of said associated circuit portion has reached or exceeded said predetermined proportion of the operating supply voltage, thereby causing the output signal to be set to a logic 0 level when the first and second inputs attain logic 1 values.

13. Power control circuitry as claimed in claim 1, wherein the voltage source is a ground voltage, each power switching circuit when enabled pulls down the voltage on said at least one voltage line of said associated circuit portion towards that ground voltage, and each enable qualifying circuit sets its output signal when the voltage on said at least one voltage line of said associated circuit portion has reached or is less than the predetermined voltage.

14. Power control circuitry as claimed in claim 13, wherein each enable qualifying circuit comprises NOR logic having a first input that attains a logic 0 value when the enable signal is provided to the associated power switching circuit, and a second input that attains a logic 0 level when said at least one voltage line of said associated circuit portion has reached or is less than the predetermined voltage, thereby causing the output signal to be set to a logic 1 level when the first and second inputs attain logic 0 values.

15. Power control circuitry as claimed in claim 1, wherein said associated circuit has a standby mode of operation in which the power control circuitry isolates the associated circuit from the voltage source.

16. Power control circuitry as claimed in claim 1, wherein said associated circuit is a memory device.

17. A method of controlling the connection of a voltage source to a circuit when that circuit is to enter an active state of operation, the circuit having a plurality of circuit portions, each said circuit portion having at least one voltage line for connection to the voltage source, the method comprising the steps of:
(a) providing a series of power switching circuits, each power switching circuit being associated with one of said circuit portions;
(b) generating enable signals for each power switching circuit, each power switching circuit in response to its enable signal being set connecting the voltage source to said at least one voltage line of said associated circuit portion; and
(c) during said generating step (b) employing at least one enable qualifying circuit, each enable qualifying circuit being associated with one of the power switching circuits and generating an output signal used to determine the enable signal provided to a later power switching circuit in the series, each enable qualifying circuit setting its output signal when both the enable signal provided to the associated power switching circuit is set and said at least one voltage line of the circuit portion associated with that power switching circuit has reached a predetermined voltage level.

18. Power control logic for controlling the connection of a voltage source to an associated circuit when that associated circuit is to enter an active state of operation, the associated circuit having a plurality of circuit portions, each said circuit portion having at least one voltage line means for connection to the voltage source, the power control logic comprising:

a series of power switching means, each power switching means being associated with one of said circuit portions and being provided with an enable signal, each power switching means being responsive to its enable signal being set for connecting the voltage source to said at least one voltage line means of said associated circuit portion; and at least one enable qualifying means, each enable qualifying means being associated with one of the power switching means and for generating an output signal used to determine the enable signal provided to a later power switching means in the series, each enable qualifying means for setting its output signal when both the enable signal provided to the associated power switching means is set and said at least one voltage line means of the circuit portion associated with that power switching means has reached a predetermined voltage level.

* * * * *